US009459526B2

(12) United States Patent
Benwadih et al.

(10) Patent No.: US 9,459,526 B2
(45) Date of Patent: Oct. 4, 2016

(54) PROCESS FOR MANUFACTURING A SELF-ASSEMBLED INJECTION MONOLAYER

(75) Inventors: Mohammed Benwadih, Champigny/Marne (FR); Jamal Tallal, Saint Aubin les Elbeuf (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 265 days.

(21) Appl. No.: 13/983,159

(22) PCT Filed: Feb. 2, 2012

(86) PCT No.: PCT/IB2012/050491
§ 371 (c)(1),
(2), (4) Date: Aug. 16, 2013

(87) PCT Pub. No.: WO2012/104809
PCT Pub. Date: Aug. 9, 2012

(65) Prior Publication Data
US 2013/0316541 A1  Nov. 28, 2013

(30) Foreign Application Priority Data

Feb. 4, 2011 (FR) .................. 11 00349

(51) Int. Cl.
G03F 7/00 (2006.01)
B05D 3/12 (2006.01)
H01L 51/00 (2006.01)
H01L 51/10 (2006.01)
H01L 51/05 (2006.01)

(52) U.S. Cl.
CPC ............. G03F 7/0002 (2013.01); B05D 3/12 (2013.01); H01L 51/0004 (2013.01); H01L 51/05 (2013.01); H01L 51/102 (2013.01); H01L 51/005 (2013.01)

(58) Field of Classification Search
None
See application file for complete search history.

(56) References Cited

U.S. PATENT DOCUMENTS

| 4,392,909 A * | 7/1983 | Bohn et al. ................. 156/306.9 |
| 2006/0138392 A1 * | 6/2006 | Bowden ................. B82Y 30/00 257/1 |
| 2007/0169814 A1 * | 7/2007 | Huck ..................... B82Y 10/00 136/263 |
| 2010/0219401 A1 * | 9/2010 | Bradley et al. ................. 257/40 |
| 2010/0237323 A1 * | 9/2010 | Akai et al. ..................... 257/13 |
| 2010/0258968 A1 * | 10/2010 | Zu ................................. 264/134 |

OTHER PUBLICATIONS

Love et al.; Self-Assembled Monolayers of Thiolates on Metals as a Form of Nanotechnology; Chem. Rev. 2005, 105, 1103-1169.*
Delamarche et al.; Thermal Stability of Self-Assembled Monolayers; Langmuir 1994, 10, 4103-4108.*
Guo et al.; Overpressure Contact Printing; Nano Letters, 2004, vol. 4, No. 9, 1657-1662.*
Yamada et al.; Effect of Temperature on Structure of the Self-Assembled Monolayer of Decanethiol on Au(111) Surface; Langmuir 2000, 16, 5523-5525.*
Brondijk, Microcontact Printing of Self-Assembled Monolayers to Pattern the Light-Emission of Polymeric Light-Emitting Diodes, Applied Physics A, 95:1, pp. 1-5, 2008.

* cited by examiner

Primary Examiner — Michael P Rodriguez
(74) Attorney, Agent, or Firm — Morgan, Lewis & Bockius LLP

(57) ABSTRACT

The invention relates to a process for manufacturing a self-assembled injection monolayer (SAM) on the surface of a metal supporting member, the SAM comprising molecules with a thiol end group. The manufacturing process of the invention comprises the following steps: a) depositing the SAM of desired molecules on a zone in relief of a buffer; and b) transferring the SAM onto the surface of the supporting member by hot pressing of the zone in relief of the buffer obtained in step a). The invention is applicable in particular to the field of electronics.

12 Claims, No Drawings

PROCESS FOR MANUFACTURING A SELF-ASSEMBLED INJECTION MONOLAYER

The invention relates to a process for producing an injection self-assembled monolayer (SAM) comprising molecules comprising a thiol end group, on the surface of a metal carrier.

Self-assembled monolayers (SAM) of molecules comprising a terminal thiol grafted to a carrier made of a metal such as gold, silver, copper, nickel, platinum, palladium and aluminum are used in the fabrication of organic electronic transistors to optimize electronic transfer between the electrodes and the semiconductor material of the transistor. These are injection SAMs.

In the prior art, these injection SAMs are formed by methods using a solution of the molecules intended to form the SAM, in general alkanethiols.

Thus, Meirav Cohen-Atiya et al. describe alkanethiols adsorbing on the surface of various metals such as gold, silver and mercury, when the metal surface is submerged into a solution and alkanethiols are added to this solution while the metal surface is still submerged.

It is the S—H bond of the thiol group of the molecule that cleaves during the formation of the SAM and allows the SAM to be grafted.

However, when a liquid solution of the molecules is used during grafting of the SAM onto the metal, the solvent disturbs and decreases the grafting area.

Specifically, with this method, up to 60% of the metal area is measured as being covered after evaporation of the solvent, meaning that a contrario 40% of the metal surface is not covered.

This is reflected in a decrease in the electrical performance of the transistor.

In addition, pinholes, i.e. voids free from grafted molecules, and other defects may form in these monolayers deposited by wet processing.

Thus, relatively dense domains of grafted molecules separated by domains free from grafted molecules may form on the metal surface.

Furthermore, this method does not allow the SAM to be located with precision, in particular when the metal area is small in size (of the order of 100 μm).

In addition, when the SAMs for n-type and p-type semiconductors are different and these SAMs are located side-by-side, they cross-contaminate.

The SAMs spread and mix together.

The metal may also be observed to oxidize when the SAM is formed by wet processing.

This occurs in the case of surfaces made of a metal such as, for example, copper, chromium, aluminum and silver.

Moreover, the solvent may be repulsed by the metal of the surface, which results in holes appearing in the grafted SAM.

Microcontact printing is another known method.

This method has been used to form SAMs.

Thus, Park et al., Applied Physics Letters, 95, 113310 (2009), propose a method for locally modifying the surface energy of indium tin oxide (ITO) electrodes using hydrophobic self-assembled monolayers terminated by methyl groups.

In this method, a solution of octadecyltrichlorosilane (OTS) in anhydrous hexane is applied to the surface of stamps made of polydimethylsiloxane (PDMS).

The stamps are then spun dry.

The "inked" stamp is then brought into contact with the surface of the ITO substrate and a slight pressure is applied at 80° C., thereby aiding the spontaneous formation of Si—O bonds and forming dense, very highly localized SAMs.

The SAMs form regions terminated with methyl functional groups.

Thus, in this process, the molecules used to form the SAM are trichlorosilanes, the substrate is made of ITO, the pressure applied is said to be "slight" and the temperature used is 80° C.

In addition, the improvement obtained in the performance of the organic light-emitting diodes (OLEDs) is said to be "subtle" relative to OLEDs not comprising monoassembled layers.

Lee et al. in *J. Mater. Chem.*, 2010, 20, 663-665, for their part, provided pentacene-based low-voltage transistor inverters obtained using nanolayers printed by microcontact.

In this document, a thin-film transistor based on pentacene (PFT) was fabricated on the surface of a dielectric material by microcontact printing.

In this device, a SAM of 7-octenyltrichlorosilane (7-OTS) was printed on a dielectric oxide material, $AlO_x$, in order to modify the surface of the dielectric material $AlO_x$ or of the pentacene/dielectric material interface.

In this document, a stamp made of polydimethylsiloxane (PDMS) was treated selectively with a 7-octenyltrichlorosilane (7-OTS) solution and the 7-OTS monolayer on the PDMS stamp was transferred to the prepared ($AlO_x$) structure using no specific pressure and at room temperature.

The difference between the inverter comprising the SAM obtained from 7-OTS formed by microcontact and an inverter without such a monoassembled layer was that the voltage gain of the inverter modified with the 7-OTS molecules was lower than that of the inverter that was not modified with the 7-OTS SAM and that the inverter with the 7-OTS SAM had an effective transition voltage between 0 and −5 volts whereas the inverter without the 7-OTS SAM had a very marginal transition voltage near 0 volts.

In summary, the technique of forming monoassembled layers by microcontact has been applied only to form monoassembled layers of 7-octenyltrichlorosilane and on dielectric materials such as $AlO_x$ or ITO. In these cases, the bonds involved are bonds between a silane group and a metal oxide. For these types of bonds, effective grafting may be obtained via contact alone. However, the bonds that must be created in the invention are bonds between a sulfur atom and a metal. In this case, pressure alone is not enough to ensure grafting. In addition, in the prior art, the objective is growth of a semiconductor whereas, in the invention, the objective is to improve injection of electrons into an electrode.

In contrast with this prior art, and to overcome the problems with forming a SAM based on molecules comprising thiol groups, on a metal surface, with wet processing, the invention proposes using a process for forming a self-assembled monolayer of molecules comprising a thiol group, on the surface of a metal substrate.

Thus, the invention provides a process for producing an injection self-assembled monolayer (SAM) comprising molecules with a thiol end group, on the surface of a metal-based carrier, characterized in that it comprises the following steps:

a) depositing the SAM of desired molecules on a raised region of a stamp; and b) transferring the SAM onto the surface of the carrier by hot pressing the raised region of the stamp on which the SAM was deposited onto the surface of the carrier.

Preferably, step b) is carried out at a temperature above 90° C. and below the melting point of the constituent material of the stamp and at a force higher than or equal to 1000 N and lower than or equal to 40 000 N, during between one and twenty minutes inclusive.

More preferably, step b) is carried out at a temperature between 95° C. and 115° C. at a force of 1000 N during between five and ten minutes inclusive.

The SAM of step a) is obtained from at least one of the following molecules:
  4-(methylsulfanyl)thiophenol (MeSTP);
  4-methoxythiophenol (MeOTP);
  4-methylthiophenol (MeTP);
  4-aminothiophenol (ATP);
  4-nitrothiophenol (NOTP);
  cysteamine (CT);
  1-decanethiol (DT);
  1H,1H,2H,2H-perfluorodecanethiol (PFDT);
  1H,1H,2H,2H-perfluorooctanethiol (PFOT); and
  pentafluorobenzenethiol (PFBT).

Regarding the carrier, it is preferably made of a metal chosen from gold, silver, copper, nickel, platinum, palladium and aluminum or of a metal oxide such as ITO (indium tin oxide).

As for the stamp, it is preferably made of silicone or of polydimethylsiloxane.

In step b), the heating to the desired temperature may be obtained using a hot plate placed under the carrier.

However, the heating in step b) may also be obtained by resistive heaters inserted in the stamp.

Nevertheless, when the process according to the invention is noteworthy in that the carrier is placed between the source and drain electrodes of a transistor of an organic electronic circuit, the heating in step b) is advantageously obtained by passing an electrical current between these source and drain electrodes.

The SAM is advantageously deposited on the stamp, in step a), by wet processing and the stamp and the SAM are dried before step b) is implemented.

The invention will be better understood and other features and advantages thereof will become more clearly apparent on reading the explanatory description that follows.

The process for producing a self-assembled monolayer (injection SAM) formed from molecules comprising a thiol end group, on the surface of a metal carrier, according to the invention, involves transferring the SAM onto the surface of the metal carrier via hot pressing of a stamp on which the SAM has been deposited.

More precisely, the SAM is deposited on a raised region of the stamp.

The SAM is grafted to the surface of the carrier via the thiol end group of the molecules.

The metal carrier is preferably chosen from gold, silver, copper, nickel, platinum, palladium and aluminum. It is most preferably made of gold.

The molecules with a thiol end group preferably used in the process of the invention are the following molecules:
  4-(methylsulfanyl)thiophenol (MeSTP), which is used in monoassembled-layer form to modify work function, in particular that of gold, for an n-type semiconductor. In this case, the work function is 4.19 eV for the n-type semiconductor;
  4-methoxythiophenol (MeOTP), which is used to modify work function, in particular that of gold, for an n-type semiconductor. In this case, the work function is 4.24 eV for the n-type semiconductor;
  4-methylthiophenol (MeTP), which is used to modify work function, in particular that of gold, for an n-type semiconductor. In this case, the work function is 4.28 eV;
  4-aminothiophenol (ATP), which is used to modify work function, in particular that of gold, for an n-type semiconductor. In this case, the work function is 4.64 eV;
  1-decanethiol (DT), which is used to modify work function, in particular that of gold, for an n-type semiconductor. In this case, the work function is 4.29 eV;
  cysteamine (CT), which is used to modify work function, in particular that of gold, for an n-type semiconductor. In this case, the work function is then 4.68 eV;
  4-nitrothiophenol (NOTP), which is used to modify work function, in particular that of gold, for a p-type semiconductor. In this case, the work function is 4.84 eV;
  1H,1H,2H,2H-perfluorodecanethiol (PFDT), which is used to modify work function, in particular that of gold, for a p-type semiconductor;
  1H,1H,2H,2H-perfluorooctanethiol (PFOT), which is used to modify work function, in particular that of gold, for a p-type semiconductor; and
  pentafluorobenzenethiol (PFBT), which is used to modify work function, in particular that of gold, for a p-type semiconductor. In this case, the work function is 5.5 eV.

By way of reference, the work function of untreated gold is 4.75 eV.

The process of the invention consists in using both pressure and heat during the transfer of the SAM onto the surface of the carrier by microcontact printing in order to improve electrical performance, especially injection between the metal, more particularly gold, silver, copper, nickel, platinum, palladium and aluminum layers (between 20 nm and 100 nm in thickness, inclusive) and the organic semiconductor, for example pentacene, which is a p-type semiconductor, or perylene-diimide, which is an n-type semiconductor.

Thus, preferably, the step of transferring the SAM by microcontact printing is carried out at a temperature above 90° C. and below the melting point of the constituent material of the stamp on the surface of which the SAM is deposited, and at a force higher than or equal to 1000 N and lower than or equal to 40 000 N, during between one and twenty minutes inclusive.

However, preferably, printing times of between five and ten minutes are preferred for reasons relating to industrialization of the process.

Thus, in this case, the step of transferring the SAM is preferably carried out at a temperature between 95° C. and 115° C., inclusive, at a force of 1000 N, during between five and ten minutes, inclusive.

The heating required for the SAM transfer may be obtained using a hot plate placed under the metal carrier.

However, it may also be obtained by inserting resistive heaters into the stamp on which the SAM is deposited.

The heating may also be obtained, when the carrier is already in place between the source and drain electrodes of a transistor of an organic electronic circuit, by passing an electrical current between these source and drain electrodes.

To achieve the transfer, a stamp, for example made of silicone or polydimethylsiloxane (PDMS), on which the SAM is deposited, is used.

It is preferable, in the invention, to use a silicone stamp.

Thus, the process of the invention may also comprise a step of depositing the desired SAM on a raised region of a stamp.

This deposition may be carried out by wet processing in a way known in the art.

The SAM-covered stamp is then dried before the SAM is transferred onto the metal surface of the carrier.

In order to allow the invention to be better understood, several embodiments thereof will now be described by way of purely illustrative and nonlimiting examples.

EXAMPLE 1 (COMPARATIVE EXAMPLE)

4-(methylsulfanyl)thiophenol (MeSTP) was dispersed in ethanol. Next, this solution was dispersed over a mold made of silicone. The ethanol was then evaporated at 60° C. in order to leave just the molecule on the mold.

The silicone mold and the sample were then placed facing each other and the mold was pressed against the surface of the gold sample at 60° C. using 1000 N of pressure for one minute.

More precisely, the sample was a gold electrode. This electrode was treated beforehand with an oxygen plasma. It could have been treated mechanically or with ozone under UV. This treatment served to bring uniformity to the metal surface, before the process of the invention was carried out.

However, the electrode could also have been brought to the desired surface state by rinsing it for a few minutes in a piranha solution (sulfuric acid+oxygenated water), then rinsing it in water, before restructuring it in sulfuric acid, thereby decapping the surface.

This restructuring destroys gold oxides formed on the surface of the electrodes, which gold oxides prevent the adsorption and grafting of thiols.

EXAMPLE 2 (COMPARATIVE EXAMPLE)

The procedure was that of example 1 but a force of 10 000 N was used.

EXAMPLE 3 (COMPARATIVE EXAMPLE)

The procedure was that of example 1 but a force of 40 000 N was used.

EXAMPLES 4 to 6 (COMPARATIVE EXAMPLES)

The procedure was that of examples 1, 2 and 3, respectively, but a printing time of five minutes was used.

EXAMPLES 7 to 9 (COMPARATIVE EXAMPLES)

The procedure was that of examples 1, 2 and 3, respectively, but a printing time of ten minutes was used.

EXAMPLES 10 to 12 (COMPARATIVE EXAMPLES)

The procedure was that of examples 1, 2 and 3, respectively, but a printing time of fifteen minutes was used.

EXAMPLES 13 to 15 (COMPARATIVE EXAMPLES)

The procedure was that of examples 1, 2 and 3, respectively, but a temperature of 80° C. was used during printing.

EXAMPLES 16 to 18 (COMPARATIVE EXAMPLES)

The procedure was that of examples 1, 2 and 3, respectively, but a printing time of five minutes and a printing temperature of 80° C. were used.

EXAMPLES 19 to 21 (COMPARATIVE EXAMPLES)

The procedure was that of examples 1, 2 and 3, respectively, but a printing time of ten minutes and a printing temperature of 80° C. were used.

EXAMPLES 22 to 24 (COMPARATIVE EXAMPLES)

The procedure was that of examples 1, 2 and 3, respectively, but a printing time of fifteen minutes and a printing temperature of 80° C. were used.

EXAMPLE 25 (COMPARATIVE EXAMPLE)

The procedure was that of example 1 but a printing temperature of 100° C. was used.

EXAMPLES 26 to 27

The procedure was that of examples 2 and 3, respectively, but a printing temperature of 100° C. was used.

EXAMPLES 28 to 30

The procedure was that of examples 1, 2 and 3, respectively, but a printing time of five minutes and a printing temperature of 100° C. were used.

EXAMPLES 31 to 33

The procedure was that of examples 1, 2 and 3, respectively, but a printing time of ten minutes and a printing temperature of 100° C. were used.

EXAMPLES 34 to 36

The procedure was that of examples 1, 2 and 3, respectively, but a printing time of fifteen minutes and a printing temperature of 100° C. were used.

EXAMPLES 37 to 39

The procedure was that of examples 1, 2 and 3, respectively, but a printing time of one minute and a printing temperature of 115° C. were used.

EXAMPLES 40 to 42

The procedure was that of examples 1, 2 and 3, respectively, but a printing time of five minutes and a printing temperature of 115° C. were used.

EXAMPLES 43 to 45

The procedure was that of examples 1, 2 and 3, respectively, but a printing time of ten minutes and a printing temperature of 115° C. were used.

EXAMPLES 46 to 48

The procedure was that of examples 1, 2 and 3, respectively, but a printing time of fifteen minutes and a printing temperature of 115° C. were used.

To determine whether the SAM was actually grafted, the contact angle of water on the surface treated with the process according to the invention was measured.

Measurement of the contact angle of the droplet allowed the free energy of the surface to be inferred.

It gave an indication of how and whether the surface had changed and whether the grafted surface was polar or apolar in nature or not.

By way of reference, the surface energy of untreated gold without a grafted SAM is 42 mN/cm$^2$ and the contact angle of water on untreated gold is 70 degrees.

The electrical contact was also tested.

The results of these measurements for examples 1 to 48 above are given in table 1 below:

TABLE 1

| Temperature (° C.) | 60 | 80 | 100 | 115 |
|---|---|---|---|---|
| force (N) | 1000/10000/40000 | 1000/10000/40000 | 1000/10000/40000 | 1000/10000/40000 |
| Time (min) | 1/5/10/15 | 1/5/10/15 | 1/5/10/15 | 1/5/10/15 |
| Water droplet contact angle (°) | 65 to 70° SAM not grafted | 65 to 70° SAM not grafted | 95° grafting OK | 105° grafting OK |
| Electrical contact | Poor whatever the grafting time | Poor whatever the grafting time | Good above five minutes under 1000 N of force at 100° C. | Good above five minutes under force at 115° C. |

A clear difference in the contact angle of the droplet between the untreated gold surface and that grafted with the SAM (examples 26 to 45) will be noted from this table.

EXAMPLE 49

A trial was also carried out without heating during the microcontact printing.

This trial was carried out with a force of 10 000 N using a printing time of five minutes.

In this case, the electrical contact was very poor.

EXAMPLE 50

The procedure was that of example 1 but a printing temperature of 115° C. was used.

The SAM was well grafted and the electrical contact obtained was good.

EXAMPLES 51 to 59

The procedure was that of example 46 but the following molecules were used, respectively:
4-methoxythiophenol (MeOTP);
4-methylthiophenol (MeTP);
4-aminothiophenol (ATP);
4-nitrothiophenol (NOTP);
cysteamine (CT);
1-decanethiol (DT);
1H,1H,2H,2H-perfluorodecanethiol (PFDT);
1H,1H,2H,2H-perfluorooctanethiol (PFOT); and
pentafluorobenzenethiol (PFBT).

The results obtained were identical to those obtained with the MeSTP used in example 46.

EXAMPLE 60

In this example, the grafted molecule was PFBT and the sample on which the PFBT molecule was grafted using the process of the invention was an ITO region of a carrier.

The sample first underwent an initial decapping treatment in a 1% acetic acid solution.

A solution of another acid or even a base could also have been used.

The PFBT was dispersed in ethanol then the solution obtained was dispersed over a silicone mold.

The ethanol was then evaporated in order to leave just the molecule on the mold.

The silicone mold and the sample, or more exactly the ITO region of the sample, were then placed facing each other and the mold was pressed against the surface of the ITO region at a temperature of 115° C. using 35 000 N of force for 10 minutes.

The sample obtained was tested as above.

The water droplet contact angle was 95°, thereby demonstrating that the PFBT had grafted onto the ITO region.

In conclusion, the process of the invention allows a dense, compact and high-performance monolayer for production of organic transistors to be formed by microcontact printing.

The invention claimed is:

1. A process of producing an injection self-assembled monolayer (SAM) comprising molecules with a thiol end group, on the surface of a carrier comprising a metal or metal oxide, the process comprising the following steps:
   (a) depositing the SAM of desired molecules on a raised region of a stamp by wet processing, and drying the stamp and the SAM to produce a dried SAM that is not in solution; and
   (b) transferring the dried SAM that is not in solution onto the surface of the carrier by pressing the raised region of the stamp obtained in the step (a) onto the surface of the carrier at a desired temperature of the stamp above 90° C. and below the melting point of a constituent material of the stamp for between one and twenty minutes inclusive,
   wherein the SAM is obtained from at least one of the following molecules:
   4-(methylsulfanyl)thiophenol (MeSTP);
   4-methoxythiophenol (MeOTP);
   4-methylthiophenol (MeTP);
   4-aminothiophenol (ATP);
   4-nitrothiophenol (NOTP);
   cysteamine (CT);
   1-decanethiol (DT);
   1H,1H,2H,2H-perfluorodecanethiol (PFDT);
   1H,1H,2H,2H-perfluorooctanethiol (PFOT); and
   pentafluorobenzenethiol (PFBT).

2. The process according to claim 1, wherein the pressing is carried out at a force higher than or equal to 1000 N and lower than or equal to 40000 N.

3. The process according to claim 1, wherein the pressing is carried out at a temperature between 95° C. and 115° C. at a force of 1000 N for between five and ten minutes inclusive.

4. The process according to claim 1, wherein the carrier comprises the metal, and the metal is selected from the group consisting of gold, silver, copper, nickel, platinum, palladium and aluminum.

5. The process according to claim 1, wherein the stamp comprises silicone.

6. The process according to claim 1, wherein in the step (b), the desired temperature is obtained using a hot plate placed under the carrier.

7. The process according to claim 1, wherein in the step (b), the desired temperature is obtained by resistive heaters inserted in the stamp.

8. The process according to claim 1, wherein
the carrier is placed between the source and drain electrodes of a transistor of an organic electronic circuit and the desired temperature is obtained by passing an electrical current between these source and drain electrodes.

9. The process according to claim 1, wherein the carrier comprises ITO.

10. The process according to claim 1, wherein the stamp comprises polydimethylsiloxane.

11. A process of producing an injection self-assembled monolayer (SAM) comprising molecules with a thiol end group, on the surface of a carrier comprising a metal or metal oxide, the process comprising the following steps:
(a) depositing the SAM of desired molecules on a raised region of a stamp by wet processing, and drying the stamp and the SAM to produce a dried SAM that is not in solution; and
(b) transferring the dried SAM that is not in solution onto the surface of the carrier by pressing the raised region of the stamp obtained in the step (a) onto the surface of the carrier at a desired temperature above 90° C. and below the melting point of a constituent material of the stamp for between one and twenty minutes inclusives,
wherein the carrier is placed between the source and drain electrode of a transistor of an organic electronic circuit and the desired temperature is obtained by passing an electrical current between this source and drain electrode.

12. The process according to claim 11, wherein the surface of a carrier comprises the metal oxide.

* * * * *